United States Patent
Li et al.

(10) Patent No.: US 11,037,642 B2
(45) Date of Patent: Jun. 15, 2021

(54) METHOD FOR PROGRAMMING A MEMORY SYSTEM

(71) Applicant: Yangtze Memory Technologies Co., Ltd., Wuhan (CN)

(72) Inventors: Haibo Li, Wuhan (CN); Man Lung Mui, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/371,130

(22) Filed: Apr. 1, 2019

(65) Prior Publication Data

US 2020/0265904 A1 Aug. 20, 2020

Related U.S. Application Data

(63) Continuation of application No. PCT/CN2019/075549, filed on Feb. 20, 2019.

(51) Int. Cl.
*G11C 16/34* (2006.01)
*G11C 16/08* (2006.01)

(52) U.S. Cl.
CPC .......... *G11C 16/3486* (2013.01); *G11C 16/08* (2013.01); *G11C 16/3459* (2013.01)

(58) Field of Classification Search
CPC .. G11C 16/3486; G11C 16/08; G11C 16/3459
USPC .................................................. 365/185.22
See application file for complete search history.

(56) References Cited

U.S. PATENT DOCUMENTS

| 7,548,462 | B2 | 6/2009 | Hung |
| 8,208,310 | B2 | 6/2012 | Dong |
| 8,248,850 | B2 | 8/2012 | Dutta |
| 9,449,695 | B2 | 9/2016 | Kim |
| 2007/0014163 | A1* | 1/2007 | Kim ................... G11C 16/3459 365/189.12 |
| 2009/0287975 | A1* | 11/2009 | Kim .................... G11C 11/5628 714/746 |
| 2010/0002523 | A1 | 1/2010 | Park |

(Continued)

FOREIGN PATENT DOCUMENTS

| CN | 101335048 A | 12/2008 |
| CN | 102754165 A | 10/2012 |

(Continued)

*Primary Examiner* — Sung Il Cho
(74) *Attorney, Agent, or Firm* — Winston Hsu

(57) ABSTRACT

A memory system includes a plurality of memory cells, and the memory cells are multiple-level cells. The memory system performs program operations to program the memory cells. After each program operation, at least one threshold voltage test is performed to determine if threshold voltages of the memory cells are greater than the verification voltage. When the threshold voltage of a first memory cell is determined to be greater than a first verification voltage, the first memory cell will be inhibited from being programmed during the next program operation. When the threshold voltage of a second memory cell is determined to newly become greater than a second verification voltage, where the second verification voltage is greater than the first verification voltage, the second memory cell will be programmed again during the next program operation.

10 Claims, 3 Drawing Sheets

(56) References Cited

U.S. PATENT DOCUMENTS

| | | | |
|---|---|---|---|
| 2011/0194346 A1* | 8/2011 | Yoon | G11C 16/10 |
| | | | 365/185.03 |
| 2012/0140566 A1 | 6/2012 | Aritome | |
| 2013/0336057 A1 | 12/2013 | Chung | |
| 2014/0153329 A1* | 6/2014 | Kang | G11C 16/3459 |
| | | | 365/185.03 |
| 2014/0219027 A1 | 8/2014 | Dong | |
| 2015/0078093 A1* | 3/2015 | Hahn | G11C 11/5628 |
| | | | 365/185.19 |
| 2015/0348633 A1* | 12/2015 | Song | G11C 11/5642 |
| | | | 365/185.19 |
| 2016/0071581 A1* | 3/2016 | Lee | G11C 11/5628 |
| | | | 365/185.03 |
| 2016/0118126 A1 | 4/2016 | Moon | |
| 2017/0154677 A1* | 6/2017 | Lim | G11C 16/0483 |

FOREIGN PATENT DOCUMENTS

| | | |
|---|---|---|
| CN | 102947888 A | 2/2013 |
| CN | 105097034 A | 11/2015 |
| CN | 107633865 A | 1/2018 |
| CN | 107689245 A | 2/2018 |

\* cited by examiner

METHOD FOR PROGRAMMING A MEMORY SYSTEM

CROSS REFERENCE TO RELATED APPLICATIONS

This application is a continuation of PCT Application No. PCT/CN2019/075549 filed on Feb. 20, 2019, the entire contents of which are incorporated herein by reference.

BACKGROUND OF THE INVENTION

1. Field of the Invention

The present invention is related to a method for programming a memory system, and more particularly, to a method for programming a memory system to reduce the retention error.

2. Description of the Prior Art

NAND flash memory is a type of non-volatile storage medium that has been widely used in many fields including notebook, mobile phones, and hard drive. However, the data stored in NAND flash memory may not always be stable and fixed. For example, as the flash memory cells lose charges over time, the data stored in the flash memory cells may change and become invalid. The retention error would be even more detrimental when the flash memory cells are multiple-level cells (MLC).

One of the reasons that causes the retention error is called the instant (or initial) threshold voltage(Vt) shift (IVS), which means that the threshold voltage raised by the program operation may drop within a short period of time after the program operation. Sometimes, the IVS can be as significant as 200 mV to 300 mV. In this case, the read margin will be reduced, and the data stored in some of the flash memory cells may become invalid.

SUMMARY OF THE INVENTION

One embodiment of the present invention discloses a method for programming a memory system. The memory system includes a plurality of memory cells, and the plurality of memory cells are multiple-level cells (MLC).

The method includes performing a plurality of program operations to program the plurality of memory cells, after each of the plurality of program operations, performing at least one threshold voltage test to determine if threshold voltages of the plurality of memory cells are greater than at least one verification voltage, when a threshold voltage of a first memory cell is determined to be greater than a verification voltage corresponding to a programming state lower than a predetermined programming state, inhibiting the first memory cell from being programmed during a next program operation, and when a threshold voltage of a second memory cell is determined to newly become greater than a verification voltage corresponding to a programming state no lower than a predetermined programming state, keeping programming the second memory cell during a next program operation.

Another embodiment of the present invention discloses a method for programming a memory system. The memory system includes a plurality of memory cells, and the plurality of memory cells are multiple-level cells (MLC).

The method includes performing a plurality of program operations to program the plurality of memory cells, after each of the plurality of program operations, performing at least one threshold voltage test to determine if threshold voltages of the plurality of memory cells are greater than at least one verification voltage, when a threshold voltage of a first memory cell is determined to be greater than a first verification voltage, inhibiting the first memory cell from being programmed during a next program operation, and after a predetermined number of program operations have been performed, increasing verification voltages to be tested in following threshold voltage tests.

Another embodiment of the present invention discloses a method for programming a memory system. The memory system includes a plurality of memory cells, and the plurality of memory cells are multiple-level cells (MLC).

The method includes performing a plurality of program operations to program the plurality of memory cells, after each of the plurality of program operations, performing at least one threshold voltage test to determine if threshold voltages of the plurality of memory cells are greater than at least one verification voltage, when a threshold voltage of a first memory cell is determined to be greater than a first verification voltage, inhibiting the first memory cell from being programmed during a next program operation, and after a threshold voltage test corresponding to a target programming state of the plurality of memory cells is performed, increasing verification voltages to be tested in following threshold voltage tests corresponding to all programming states of the plurality of memory cells.

Another embodiment of the present invention discloses a memory system. The memory system includes a plurality of memory cells coupled to at least one word line, and a control circuit coupled to the at least one word line. The plurality of memory cells are multiple-level cells (MLC).

The control circuit performs a plurality of program operations to program the plurality of memory cells by providing program voltages through the at least one word line, performs at least one threshold voltage test to determine if threshold voltages of the plurality of memory cells are greater than at least one verification voltage after each of the plurality of program operations. The control circuit inhibits a first memory cell from being programmed during a next program operation when a threshold voltage of the first memory cell is determined to be greater than a verification voltage corresponding to a programming state lower than a predetermined programming state. The control circuit keeps programming a second memory cell during a next program operation when a threshold voltage of the second memory cell is determined to newly become greater than a verification voltage corresponding to a programming state no lower than a predetermined programming state.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
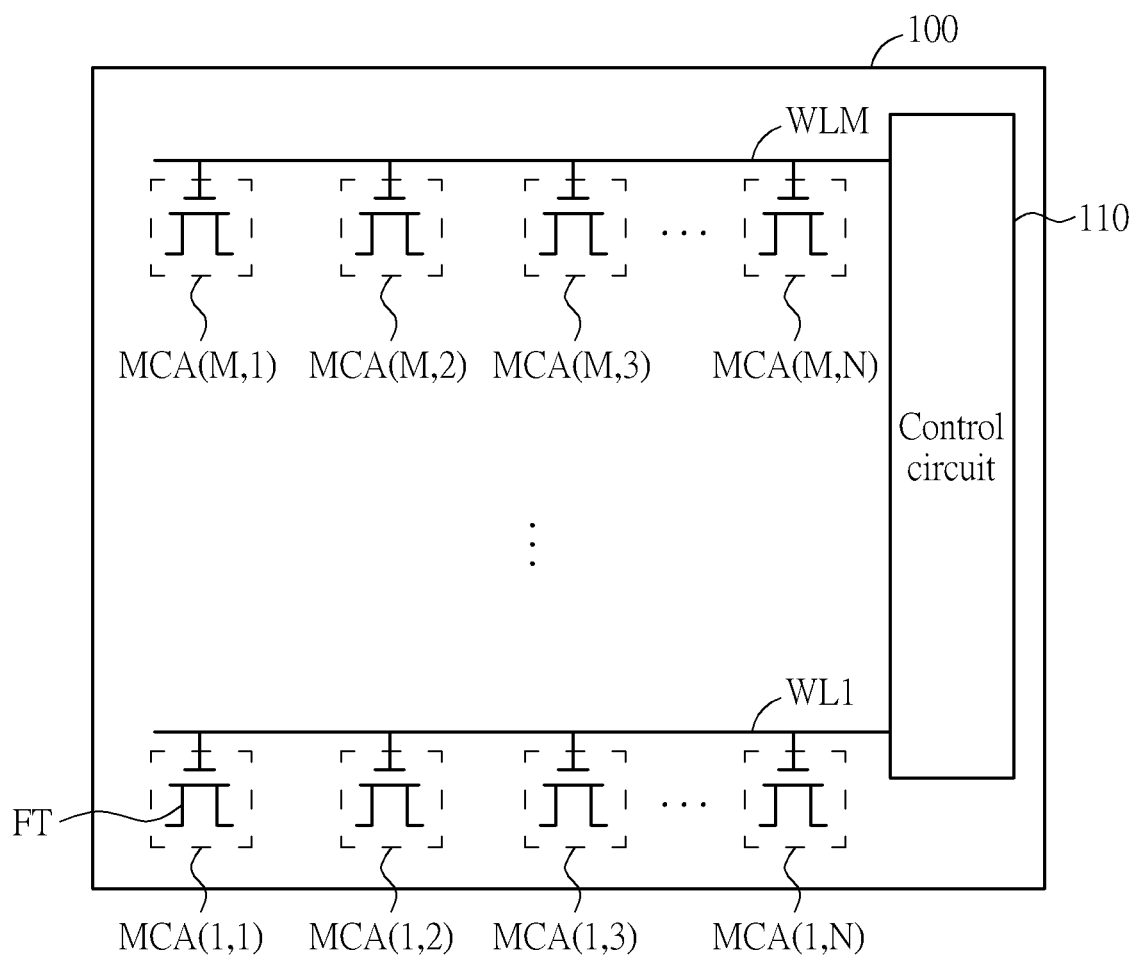
FIG. 1 shows a memory system according to one embodiment of the present invention.

FIG. 1 shows a memory system 100 according to one embodiment of the present invention. The memory system 100 includes a plurality of memory cells MCA(1,1) to MCA(M,N) and a control circuit 110, where M and N are positive integers. In some embodiments of the present invention, the memory system 100 can be a flash memory, such as a NAND type flash memory.

In FIG. 1, N memory cells can be coupled to the same corresponding word line. For example, the memory cells MCA(1,1) to MCA(1,N) can be coupled to the word line WL1, and the memory cells MCA(M,1) to MCA(M,N) can be coupled to the word line WLM. Also, the control circuit 110 is coupled to the word lines WL1 to WLM for controlling the memory cells MCA(M,1) to MCA(M,N) for programming operations.

In some embodiments, memory cells coupled to the same word line can be programmed at the same time by applying the program voltage through the word line.

In some embodiments, the memory cells MCA(1, 1) to MCA(M,N) can be multiple-level cells (MLC), including quad-level cells (QLC) and triple-level cells (TLC). That is, each of the memory cells MCA(1,1) to MCA(M,N) can store data of multiple bit states.

For example, each of the memory cells MCA(1,1) to MCA(M,N) can include a floating gate transistor FT. During a program operation of the memory cells MCA(1,1) to MCA(M,N), the gate terminals of the floating gate transistors FT of the memory cells MCA(1,1) to MCA(M,N) can receive a program voltage from the word lines WL1 to WLM, and the first terminals of the floating gate transistors FT of the memory cell MCA(1,1) to MCA(M,N) can receive a reference voltage. In some embodiments, the program voltage can be greater than the reference voltage, and thus the high cross voltage between the gate terminals and the first terminals of the floating gate transistors FT will inject electrons to the gate structures of the floating gate transistors FT, increasing the threshold voltage of the floating gate transistors FT.

By injecting sufficient electrons to the gate structures of the floating gate transistors FT, the threshold voltages of the floating gate transistors FT will be raised to the desired levels. Consequently, the state of data stored in the memory cells MCA(1,1) to MCA(M,N) can be identified according to the levels of the threshold voltages of the floating gate transistors FT of the memory cells MCA(1, 1) to MCA(M, N).

For example, the memory cells MCA(1,1) to MCA(M,N) may be able to store eight different states of data. In this case, if the threshold voltage of the memory cell MCA(1,1) is smaller than a first verification voltage, then the memory cell MCA(1,1) may be deemed as not being programmed, and the memory cell MCA(1,1) may be deemed as having a first programming state. However, if the threshold voltage of the memory cell MCA(1,1) is greater than the first verification voltage, then the memory cell MCA(1,1) may be deemed as being programmed to have a second programming state. Also, if the memory cell MCA(1,1) is kept being programmed to have its threshold voltage being greater than a second verification voltage which is greater than the first verification voltage, then the memory cell MCA(1, 1) will be deemed as being programmed to have a third programming state, and so on. In some other embodiments, the memory cells MCA(1,1) to MCA(M,N) may be able to store more or less states of data, and the states of data may be represented by threshold voltages with different orders according to the application need.

However, after the memory cells MCA(1,1) to MCA(M, N) are programmed to the desired levels of threshold voltages, the threshold voltages of the memory cells MCA(1,1) to MCA(M,N) may be dropped within a short period of time, which is the so called instant threshold voltage shift (or initial threshold voltage shift). The instant threshold voltage shift may result in the threshold voltages of some of the memory cells MCA(1,1) to MCA(M,N) dropping below the verification voltage, thereby causing the data stored in some of the memory cells MCA(1,1) to MCA(M,N) to fault.

To address the issue caused by instant threshold voltage shift, multiple-programming has been proved to be effective. That is, after the memory cell has been programmed to have its threshold voltage become greater than the corresponding verification voltage, an additional program operation can be performed to the memory cell to reduce the instant threshold voltage shift of the memory cell.

Figure 2:
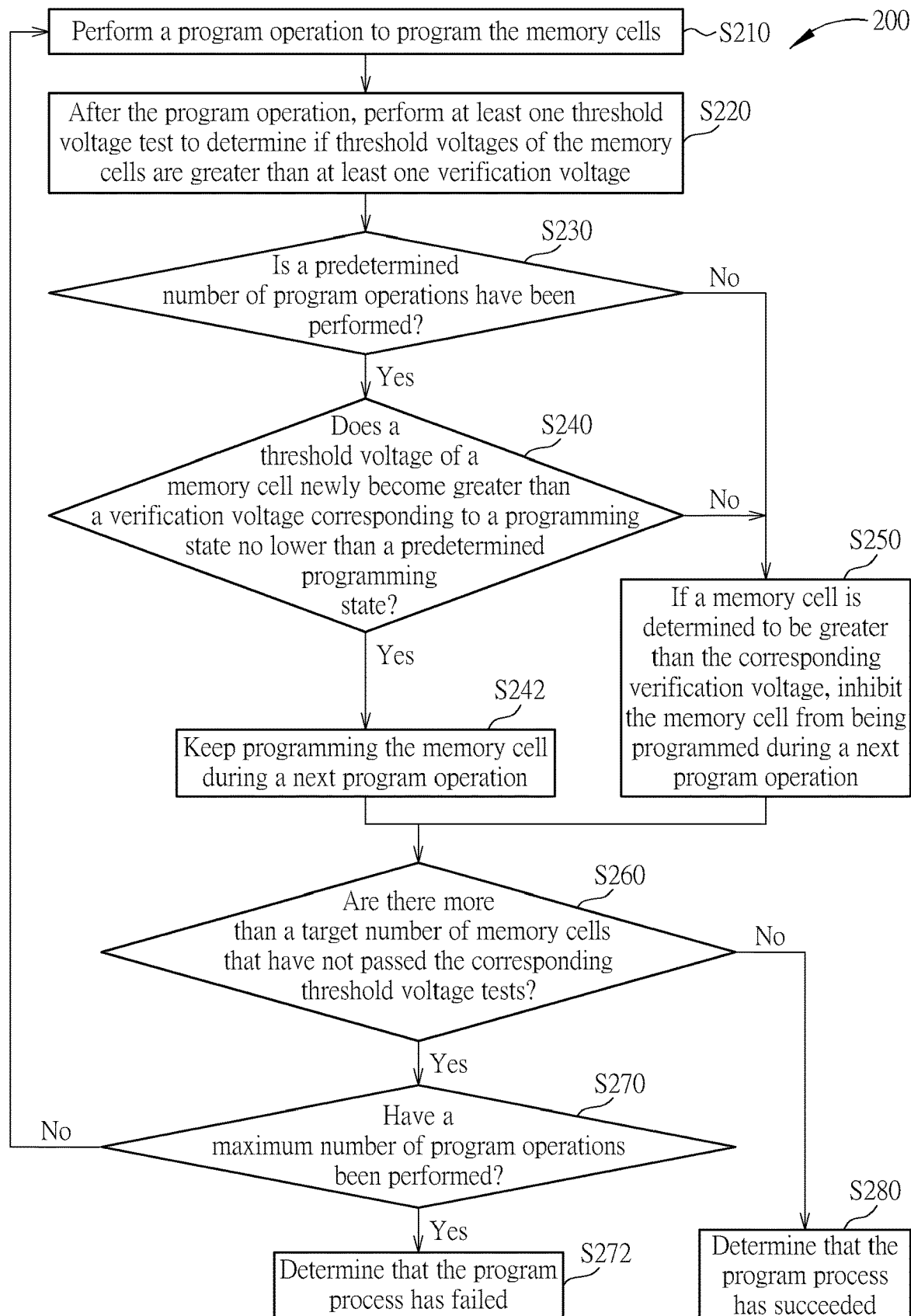
FIG. 2 shows a method for operating the memory system in FIG. 1 according to one embodiment of the present invention.

FIG. 2 shows a method 200 for operating the memory system 100 according to one embodiment of the present invention. In some embodiments, the method 200 can include steps S210 to S280 as shown in FIG. 2, but is not limited to the order shown in FIG. 2.

S210: perform a program operation to program the memory cells MCA(1,1) to MCA(M,N);

S220: after the program operation, perform at least one threshold voltage test to determine if threshold voltages of the memory cells MCA(1,1) to MCA(M,N) are greater than at least one verification voltage;

S230: if a predetermined number of program operations have been performed, go to Step S240, otherwise go to Step S250;

S240: if a threshold voltage of a memory cell is determined to newly become greater than a verification voltage corresponding to a programming state no lower than a predetermined programming state, go to step S242, otherwise go to step S250;

S242: keep programming the memory cell during a next program operation;

S250: if a memory cell is determined to be greater than the corresponding verification voltage, inhibit the memory cell from being programmed during a next program operation;

S260: if there are more than a target number of memory cells that have not passed the corresponding threshold voltage tests, go to step S270, otherwise go to step S280;

S270: if a maximum number of program operations have been performed, go to step S272, otherwise go to step S210;

S272: determine that the program process has failed.

S280: determine that the program process has succeeded.

In some embodiments, steps S210 to S280 can be performed by the control circuit 110. That is the control circuit 110 can provide the desired program voltages according to the programming progress.

In step S210, the program operation can be performed to raise the threshold voltages of the memory cells MCA(1,1) to MCA(M,N), and every time after the program operation is performed, at least one threshold voltage test can be performed to determine if the threshold voltages of the memory cells MCA(1,1) to MCA(M,N) are greater than at least one verification voltage. For example, a program operation may be performed to program the memory cell MCA(1, 1) to have the second programming state. In this case, a threshold voltage test corresponding to the second programming state will be performed in step S220. Also, the same program operation may also program the memory cell MCA(1,2) to have the third programming state. In this case, a threshold voltage test corresponding to the third programming state will also be performed in step S220.

Generally, if the memory cell MCA(1, 1) is meant to be programmed to have the second programming state and the memory cell MCA(1,1) has passed the threshold voltage test corresponding to the second programming state, then the memory cell MCA(1,1) would be inhibited during the next program operation as shown in step S250. However, if the memory cell MCA(1, 1) has not passed the threshold voltage test corresponding to the second programming state, meaning the threshold voltage of the memory cell MCA(1,1) is still smaller than the corresponding verification voltage, then the memory cell MCA(1,1) will be programmed during the next program operation to keep raising its threshold voltage.

In FIG. 2, to reduce the instant threshold voltage shift, a reprogramming scheme can be applied when a predetermined number of program operations have been performed and a threshold voltage of the memory cell is determined to newly become greater than a verification voltage that is not smaller than the predetermined verification voltage. Namely, for memory cells to be programmed to higher programming states, the additional program operation can be applied to further secure the threshold voltage.

For example, in some embodiments, the predetermined verification voltage can be corresponding to the sixth programming state. In this case, if the memory cell MCA(1,2) is meant to be programmed to the sixth programming state and has been determined to newly become greater than the verification voltage corresponding to the sixth programming state in step S220, then, instead of being inhibited, the memory cell MCA(1,2) will be programmed again during the next program operation. Therefore, the affection of the instant threshold voltage shift on the memory cell MCA(1,2) can be reduced.

The additional program operations are performed to memory cells meant to be programmed to higher programming states because the issue of instant threshold voltage shift can become more significant when the threshold voltages of the memory cells become higher. Also, if the additional program operation is added when the memory cells have lower programming states, then the memory cells may be over programmed when they are programmed to have the higher programming states, which may deteriorate the memory cells and cause instability.

Therefore in step 230, the number of program operations performed will be checked before applying the additional program operation for preventing over programming. For example, in some embodiments, before the 18$^{th}$ program operation, the memory cells passing the threshold voltage tests will always be inhibited during the next program operation as shown in step S250. However, after the 17$^{th}$ program operation, the additional program operation will be performed to those memory cells that are determined to newly become greater than the verification voltage corresponding to the higher programming states as shown in steps S240 and S242.

In this case, if the threshold voltage of the memory cell MCA(1,1) is determined to be greater than the verification voltage corresponding to the first programming state, the memory cell MCA(1, 1) will be inhibited during the next program operation as shown in step S250. After the program operations have been performed more than a predetermined number of times, for example but not limited to 17 times, if the threshold voltage of the memory cell MCA(1,2) is determined to newly become greater than the verification voltage corresponding to the sixth programming state, the memory cell MCA(1,2) will be programmed again during the next program operation. However, before the program operations have not been performed more than 17 times, even if the threshold voltage of the memory cell MCA(1, 3) is determined to newly become greater than the verification voltage corresponding to the sixth programming state, the memory cell MCA(1,3) will still be inhibited during the next program operation.

Furthermore, in some embodiments, by reprogramming the memory cells having high programming states may be enough to prevent over programming. In this case, step S230 may be omitted, and the additional program operation will be performed to all memory cells that have been determined to newly become greater than the verification voltages corresponding to higher programming states without considering the number of program operations that have been performed.

In addition, to improve the efficiency of the program operation, the incremental step pulse programming (ISPP) can be applied to the method 200. For example, in method 200, during a first program operation, a first program pulse may be generated to program the memory cells MCA(1,1) to MCA(M,N) while during a second program operation after the first program operation, a second program pulse may be generated to program the memory cells MCA(1,1) to MCA(M,N). In this case, the second program pulse can have a voltage greater than the first program pulse to help to increase the threshold voltages of the memory cells MCA(1, 1) to MCA(M,N) in the second program operation.

After steps S240, S242 and S250, step S260 can be performed to determine if there are more than a target number of memory cells that have not passed the corresponding threshold voltage tests. If there are more than the target number of memory cells that have not passed the corresponding threshold voltage tests, it may imply that the memory system 100 has not been programmed successfully and may need more times of program operation. However, if there are less than the target number of memory cells that have not passed the corresponding threshold voltage tests, it may imply that the memory system 100 has been programmed successfully as concluded in step S280.

Furthermore, in some embodiments, the total number of the program operations can be limited to be under a maximum number for preventing over programming and endless operations. Therefore, in step S270, if the program operations have been performed for more than the maximum number of times, then the program process will be determined to have failed in step S272. Otherwise, the next program operation will be performed in step S210.

With method 200, the threshold voltages of the memory cells can be steadily secured, and the retention error caused by instant threshold voltage shift can be reduced.

Figure 3:
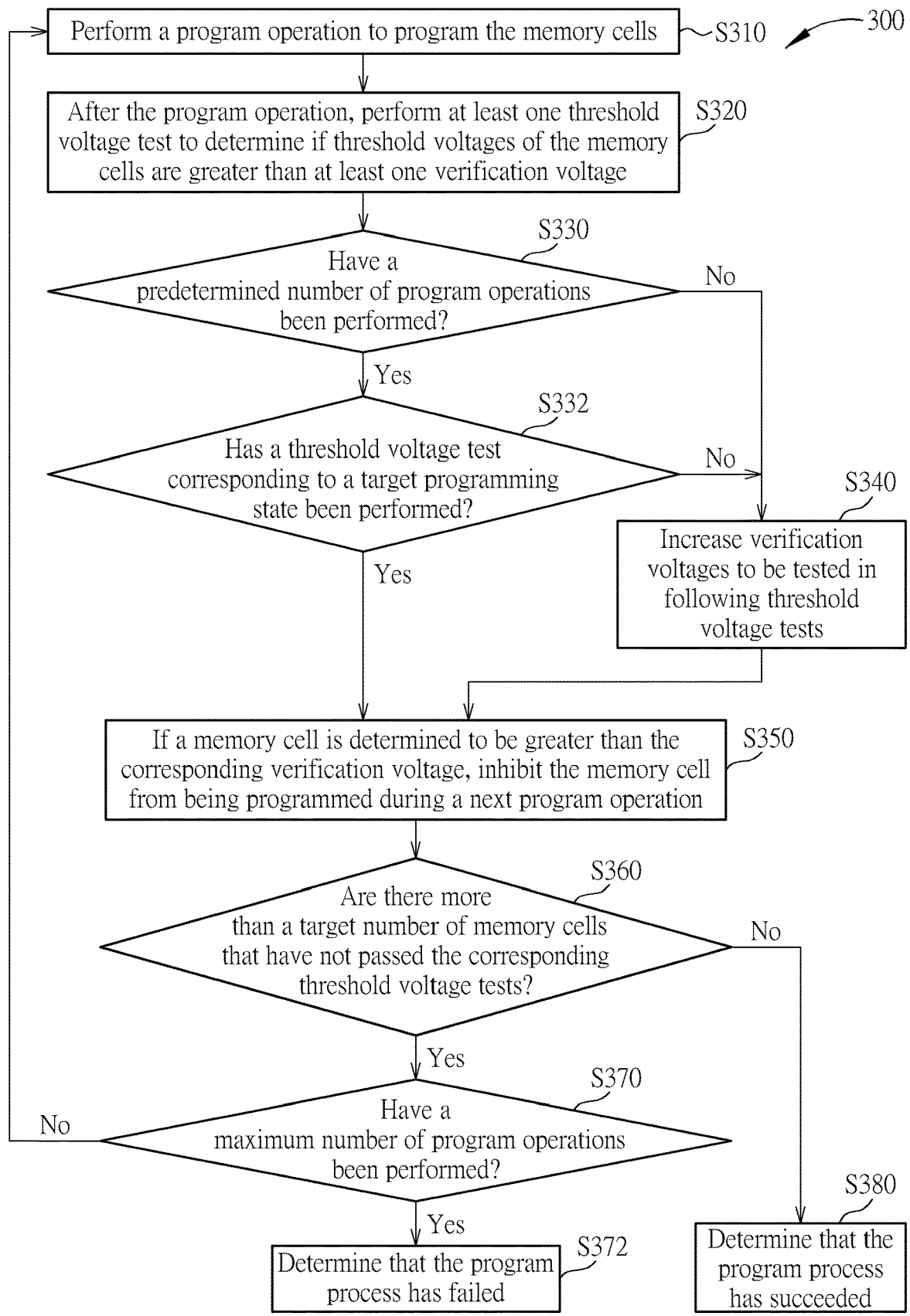
FIG. 3 shows a method for operating the memory system in FIG. 1 according to another embodiment of the present invention.

FIG. 3 shows a method 300 for operating the memory system 100 according to another embodiment of the present invention. In some embodiments, the method 300 can include steps S310 to S380 as shown in FIG. 3, but is not limited to the order shown in FIG. 3.

S310: perform a program operation to program the memory cells MCA(1,1) to MCA(M,N);

S320: after the program operation, perform at least one threshold voltage test to determine if threshold voltages of the memory cells MCA(1,1) to MCA(M,N) are greater than at least one verification voltage;

S330: if a predetermined number of program operations have been performed, go to step S340, otherwise go to step S332;

S332: if a threshold voltage test corresponding to a target programming state has been performed, go to step S340, otherwise go to step S350;

S340: increase verification voltages to be tested in following threshold voltage tests;

S350: if a memory cell is determined to be greater than the corresponding verification voltage, inhibit the memory cell from being programmed during a next program operation;

S360: if there are more than a target number of memory cells that have not passed the corresponding threshold voltage tests, go to step S370, otherwise go to step S380;

S370: if a maximum number of program operations have been performed, go to step S372, otherwise go to step S310;

S372: determine that the program process has failed.

S380: determine that the program process has succeeded.

In some embodiments, steps S310 to S380 can be performed by the control circuit 110. That is the control circuit 110 can provide the desired program voltages according to the programming progress.

In method 300, instead of performing additional program operations, the verification voltage can be increased to reduce the retention error caused by the instant threshold voltage shift.

For example, after the program operation in step S310 and the threshold voltage tests in step S320 are performed, step S330 will determine if the predetermined number of program operations have been performed. If the program operations have been performed more than the predetermined number of times, for example but not limited to 17 times, then the verification voltages to be tested in following threshold voltage tests will be increased in step S340. That is, to pass the threshold voltage corresponding to a specific programming state, the threshold voltage of the memory cell must be higher than a previous standard level. Consequently, even if the instant threshold voltage shift occurs, the threshold voltage of the memory cell will still be high enough to acquire the desired programming state during the read operation.

Also, the programming state of the threshold voltage test will be checked in step S332. In this case, if the threshold voltage test corresponding to a target programming state, for example but not limited to the sixth programming state, has been performed, then the verification voltages to be tested in following threshold voltage tests will be increased in step S340. Therefore, memory cells that are meant to be programmed to higher programming states and are more difficult to be programmed will be tested more strictly during the program process to prevent the instant threshold voltage shift from causing retention errors.

One of the reasons for not increasing the verification voltages in the very beginning of the program process is to protect the memory cells MCA(1,1) to MCA(M,N) from being over programmed. However, in some embodiments, one of the steps S330 and S332 may be omitted if the condition of the memory system 100 allows.

In summary, the memory system and the methods for programming the memory systems provided by the embodiment of the present invention can perform additional program operations to memory cells that have newly passed the threshold voltage tests or can increase the verification voltages in the threshold voltage tests corresponding to higher programming states. Therefore, the memory cells can be programmed to have threshold voltages greater than the verification voltages used in the read operation with sufficient headroom, preventing the retention errors caused by the instant threshold voltage shift and securing the reading voltage margin.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for programming a memory system, the memory system comprising a plurality of memory cells, the method comprising:

performing a plurality of program operations to program the plurality of memory cells;

after each of the plurality of program operations, performing at least one threshold voltage test to determine if threshold voltages of the plurality of memory cells are greater than at least one verification voltage;

when a threshold voltage of a first memory cell is determined to be greater than a first verification voltage corresponding to a first programming state, inhibiting the first memory cell from being programmed during a next program operation; and when a second memory cell is to be programmed into a second programming state and a threshold voltage of the second memory cell is determined to newly become greater than a second verification voltage corresponding to the second programming state, keeping programming the second memory cell during a next program operation;

wherein:

the plurality of memory cells are multiple-level cells (MLC);

the first programming state is lower than a predetermined programming state; and the second programming state is no lower than the predetermined programming state.

2. The method of claim 1, wherein when the threshold voltage of the second memory cell is determined to newly become greater than the second verification voltage corresponding to the second programming state, keeping programming the second memory cell during the next program operation is:

when the threshold voltage of the second memory cell is determined to newly become greater than the second verification voltage corresponding to the second programming state and a predetermined number of program operations have been performed, keeping programming the second memory cell during the next program operation.

3. The method of claim 2, further comprising:

before the predetermined number of program operations have been performed, when a threshold voltage of a third memory cell is determined to newly become greater than the second verification voltage, inhibiting the third memory cell from being programmed during a next program operation.

4. The method of claim 2, further comprising:

when there are more than a target number of memory cells that have not passed corresponding threshold voltage tests, performing a next program operation.

5. The method of claim 1, further comprising:

during a first program operation of the plurality of program operations, generating a first program pulse to program the plurality of memory cells; and during a second program operation of the plurality of program operations after the first program operation, generating a second program pulse to program the plurality of memory cells;

wherein the second program pulse has a voltage greater than the first program pulse.

6. A memory system comprising:
a plurality of memory cells coupled to at least one word line; and
a control circuit coupled to the at least one word line, and configured to:
perform a plurality of program operations to program the plurality of memory cells by providing program voltages through the at least one word line;
perform at least one threshold voltage test to determine if threshold voltages of the plurality of memory cells are greater than at least one verification voltage after each of the plurality of program operations;
inhibit a first memory cell from being programmed during a next program operation when a threshold voltage of the first memory cell is determined to be greater than a first verification voltage corresponding to a first programming state; and
keep programming a second memory cell during a next program operation when the second memory cell is to be programmed into a second programming state and a threshold voltage of the second memory cell is determined to newly become greater than a second verification voltage corresponding to the second programming state;
wherein:
the plurality of memory cells are multiple-level cells (MLC);
the first programming state is lower than a predetermined programming state; and
the second programming state is no lower than the predetermined programming state.

7. The memory system of claim 6, wherein the control circuit keeps programming the second memory cell during the next program operation when the threshold voltage of the second memory cell is determined to newly become greater than the second verification voltage corresponding to the second programming state while a predetermined number of program operations have been performed.

8. The memory system of claim 7, wherein the control circuit is further configured to inhibit a third memory cell from being programmed during a next program operation when a threshold voltage of the third memory cell is determined to newly become greater than the second verification voltage and before the predetermined number of program operations have been performed.

9. The memory system of claim 7, wherein the control circuit is further configured to performing a next program operation when there are more than a target number of memory cells that have not passed corresponding threshold voltage tests.

10. The memory system of claim 6, wherein the control circuit is further configured to:
generate a first program pulse to program the plurality of memory cells during a first program operation of the plurality of program operations; and
generating a second program pulse to program the plurality of memory cells during a second program operation of the plurality of program operations after the first program operation;
wherein the second program pulse has a voltage greater than the first program pulse.

* * * * *